(12) United States Patent
Wood et al.

(10) Patent No.: US 6,627,904 B1
(45) Date of Patent: Sep. 30, 2003

(54) ION IMPLANTATION APPARATUS

(75) Inventors: Peter Wood, Ifold (GB); Richard Cooke, Sturrington (GB); Anthony Adlam, Partridge Green (GB)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/561,992

(22) Filed: May 2, 2000

(30) Foreign Application Priority Data

May 24, 1999 (GB) ............................................. 9912063
Mar. 8, 2000 (GB) ............................................. 0005567

(51) Int. Cl.⁷ ........................................... H01J 37/317
(52) U.S. Cl. ................. 250/492.21; 250/443.1
(58) Field of Search ................. 250/440.11, 442.11, 250/492.21, 492.1, 492.3, 441.11, 492.23, 492.2, 443.1, 398, 297

(56) References Cited

U.S. PATENT DOCUMENTS 5,432,352 A * 7/1995 van Bavel ............. 250/492.21
5,608,223 A * 3/1997 Hirokawa et al. ...... 250/447.11
5,641,969 A * 6/1997 Cooke et al. .......... 250/492.21

* cited by examiner

Primary Examiner—John R. Lee
Assistant Examiner—Phillip A. Johnston
(74) Attorney, Agent, or Firm—Boult Wade Tennant

(57) ABSTRACT

The invention relates to an ion implantation apparatus comprising a vacuum chamber, an ion beam generator generating an ion beam in the vacuum chamber and an implant wheel in the vacuum chamber. The wheel has a plurality of circumferentially distributed wafer support elements. A scanning arm is mounted for reciprocal movement about a scan axis and has a free end supporting the implant wheel for rotation about a wheel axis, so that rotation of the implant wheel about the axis brings the wafer support elements successively to intercept the ion beam and reciprocation of the scanning arm about the scan axis scans the ion beam across the wafer support elements. A motor drives the scanning arm, the motor having a drive shaft connected directly to a cycloid type gearbox, the output of which directly drives the scanning arm.

13 Claims, 6 Drawing Sheets

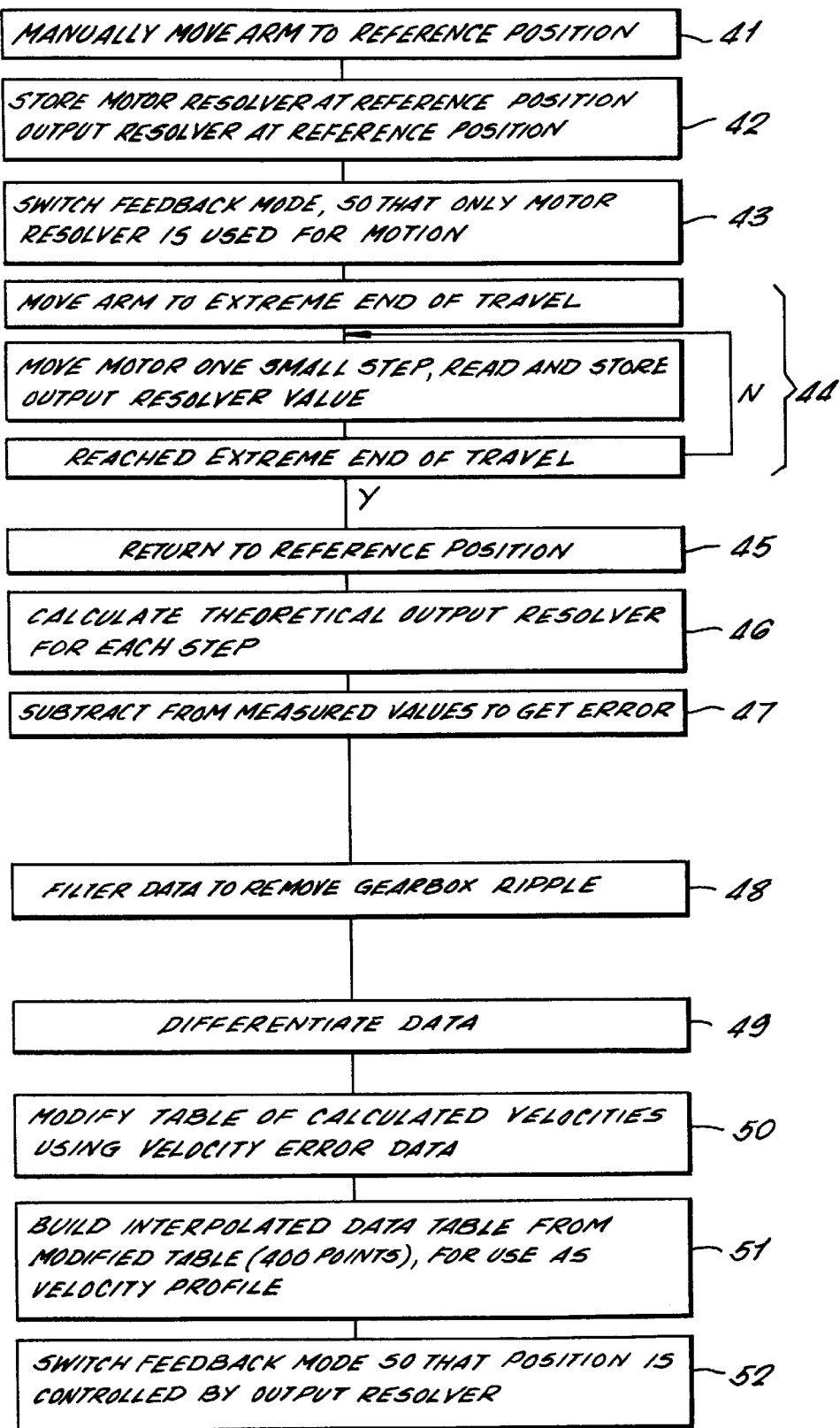

ION IMPLANTATION APPARATUS

The invention relates to ion implantation apparatus. Such an apparatus is used for implanting ions of preselected chemical species into semiconductor wafers for manufacturing desired semiconductor electronic devices. The present invention is particularly concerned with apparatus for scanning semiconductor wafers under treatment relative to the ion beam to ensure an even dose of ions is delivered to all parts of the wafer.

In one form of ion implantation apparatus, wafers for treatment are mounted at a number of discreet positions around the periphery of an implant wheel. The wheel is mounted at the free end of a scanning arm which is mounted at its other end for reciprocating motion about a scanning axis. The scanning arm and implant wheel are located in a vacuum chamber to which a beam of desired ions is directed from an ion source. As the wheel rotates about a wheel axis at the end of the scanning arm, the various wafers mounted around the periphery of the wheel are brought successively in front of the beam. At the same time, the scanning arm more slowly moves the axis of rotation of the wheel to and fro, so that the ion beam is progressively scanned over the whole surface of the wafers.

Apparatus of this kind is known from U.S. Pat Nos. 4,733,091 and U.S. Pat No. 5,641,969.

In U.S. Pat No. 4,733,091, the scanning arm of the apparatus is mounted for reciprocating movement by means of a rotary vacuum seal on the scan axis of the scanning arm. The implant wheel is driven by means of drive shafts and belts from outside thee vacuum chamber, with the drive belts extending the length of the scanning arm to drive the shaft of the implant wheel rotatably mounted at the free end of the scanning arm.

An improvement of this apparatus is disclosed in U.S. Pat No. 5,641,969. In this patent a motor is mounted at the free end of the scanning arm so as to rotate directly the implant wheel about the wheel axis. The scan arm is driven by a separate motor mounted outside the vacuum chamber through a rotary vacuum seal.

In this prior art apparatus the scan arm is driven by a leadscrew, arranged such that the velocity of the leadscrew is proportional to the velocity of the centre of the wheel relative to the beam. Custom electronics then provide a control velocity to the leadscrew that varies as a function of wheel radius in the beam. This arrangement provides very high levels of process uniformity. In this arrangement the whole scanning system is mounted at an angle relative to the ion beam of typically 70, such that the ion beam is perpendicular to a wafer mounted on the wheel which is canted inwardly 70 towards the axis of the wheel. This mounting causes motion of the wafer along the line of the ion beam as the wheel is scanned. Because the beam is not a perfectly parallel beam, this movement causes non-uniformities in the implantation operation.

According to a first aspect of the present invention there is provided an ion implantation apparatus comprising a vacuum chamber, an ion beam generator to generate an ion beam in the vacuum chamber, an implant wheel in the vacuum chamber, having a plurality of circumferentially distributed wafer support elements each having a wafer support surface canted inwardly towards the centre of the implant wheel, a scanning arm mounted for reciprocal movement about a scan axis and having a free end supporting the implant wheel for rotation about a wheel axis, so that rotation of the implant wheel about the wheel axis brings the wafer support elements successively to intercept the ion beam and reciprocation of the scanning arm about the scan axis scans the ion beam across the wafer support elements, wherein the wheel is rotatable with respect to the arm about a tilt axis, which substantially intersects the wheel axis and ion beam, to vary the direction of implantation, and wherein the scan axis is substantially parallel to the direction of the ion beam, and the direction of the wheel axis is offset from the direction of the scan axis such that the ion beam is substantially perpendicular to the wafer support surfaces when the implant wheel is not tilted.

This arrangement ensures that the wafers are always kept at a constant distance with respect to the ion beam, thereby achieving uniform implantation. Even when the wheel is tilted to vary the implantation angle, the position of the tilt axis ensures that there is little, if any, variation in the distance of the wafers with respect to the ion beam.

The tilt axis is preferably substantially perpendicular to the wheel axis as this provides a simple construction with little movement of the substrate relative to the ion beam when the wheel is tilted. However, if even this little movement is not tolerable, the tilt axis can substantially pass through the plane of the substrate support for the substrate being scanned by the ion beam thereby eliminating any relative movement between the substrate and the ion beam. Any positions between these two particular examples will also give favourable results.

With the arrangement of the present invention, as the scan axis and wheel axis are no longer parallel, the linear relationship between the scanning position of the wafer and the leadscrew is lost.

Therefore, according a related aspect of the present invention there is provided ion implantation apparatus comprising a vacuum chamber, an ion beam generator to generate an ion beam in the vacuum chamber, an implant wheel in the vacuum chamber, having a plurality of circumferentially distributed wafer support elements, a scanning arm mounted for reciprocal movement about a scan axis and having a free end supporting the implant wheel for rotation about a wheel axis, so that rotation of the implant wheel about the wheel axis brings the wafer support elements successively to intercept the ion beam and reciprocation of the scanning arm about the scan axis scans the ion beam, across the wafer support elements, and a motor for driving the scanning arm, the motor having a drive shaft connected through a gearbox which has an output shaft driving the scanning arm, wherein a first rotary position detector is provided on the drive shaft and a second rotary position detector is provided on the output shaft.

This arrangement provides an accurate way of determining the scanning position of the wafers. The use of the rotary position detectors either side of the gearbox allows a very accurate measurement to be made as the drive shaft is rotating faster than the output shaft by an amount equal to the ratio of the gears, which can be typically 170:1.

The data produced by the rotary position detectors can be used to provide full positional information relating to the scan arm, and this can therefore be used for safety circuits and other related equipment thereby eliminating the need for the optical sensors provided in the prior art.

The use of the two rotary position detectors allows the mechanical integrity of the apparatus to be readily verified using a method comprising the steps of taking a reading from the second rotary position detector, calculating the theoretical position of the motor from the reading taken from the second rotary position detector and from the gearbox ratio, measuring the actual position of the motor from the first rotary position detector, and comparing the actual position of the motor with the theoretical position of the motor.

Further, the velocity profile of the apparatus can easily be corrected to allow for rotary position detector non-linearity. In this case a method is used comprising the steps of driving the scan arm across a range of movement, and noting readings from both rotary position detectors in each position, calculating from each first rotary position detector reading and from the gearbox ratio the theoretical second rotary position detector reading in each position, subtracting the theoretical second rotary position detector reading from the actual second rotary position detector reading in each position, filtering the data generated in order to remove errors generated by sources other than second rotary position detector non-linearity to obtain data indicative only of second rotary position detector non-linearity, differentiating this data to produce data indicative of velocity error, and applying this velocity error to a look up table of the desired velocity profile.

According to a further aspect of the present invention, there is provided a method of driving a member through a pre-determined velocity profile, the method comprising compiling numerical tables for velocity and position for the velocity profile, using values from the numerical tables instructing the member to move from a first position at which it is travelling at a first velocity to a second position at which it is travelling at a second velocity at an acceleration at which the member will reach the second velocity before it reaches the second position and will hence stop accelerating until it reaches the second position, and selecting the rate of reading values from the numerical tables to be fast enough that the inherent lag in the control system causes smooth acceleration of the arm throughout the velocity profile.

In this case, the member to be driven may be the scan arm referred to above.

According to a further aspect of the present invention, there is provided an ion implantation apparatus comprising a vacuum chamber, an ion beam generator to generate an ion beam in the vacuum chamber, an implant wheel in the vacuum chamber, having a plurality of circumferentially distributed wafer support elements, a scanning arm mounted for reciprocal movement about a scan axis and having a free end supporting the implant wheel for rotation about a wheel axis, so that rotation of the implant wheel about said wheel axis brings the wafer support elements successively to intercept the ion beam and reciprocation of the scanning arm about the scan axis scans the ion beam across the wafer support elements, and a motor for driving the scanning arm, the motor having a drive shaft connected directly to a cycloid type gearbox, the output of which directly drives the scanning arm.

The scan arm requires only a relatively low power motor and low torque gearbox to drive the scan arm. The use of a cycloid type gearbox, which is capable of generating very large torque may seem a surprising choice. However, such an arrangement is beneficial as it is capable of resisting very high reserve torque in case of failure.

Examples of the invention will now be described with reference to the accompanying drawings, in which:

FIG. 5 is a flow chart showing calibration of the system;

The basic ion implantation apparatus to which the present invention is applied is that illustrated in U.S. Pat. No. 5,641,969 which is incorporated herein by reference. The examples described below relate to improvements and modifications which can be applied to the implantation apparatus of U.S. Pat. No. 5,641,969.

Figure 1:
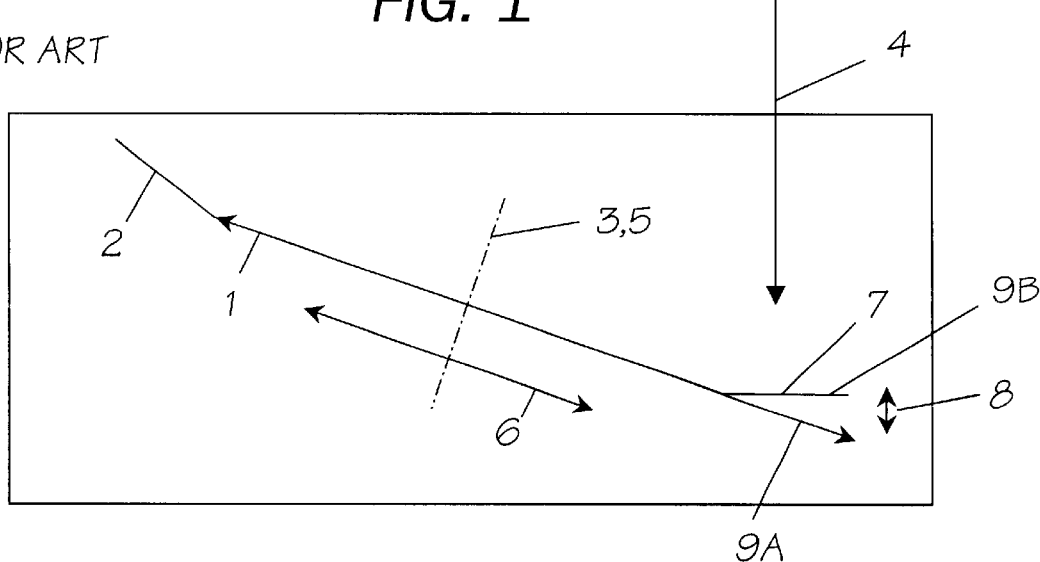
FIG. 1 is a schematic diagram showing the orientation of various axes of the ion implantation apparatus of the prior art.

FIG. 1. shows the orientation of the various axes of the implant apparatus of U.S. Pat. No. 5,641,969. In this arrangement, the scan wheel 1 is provided with a plurality of circumferentially spaced wafer support elements 2 canted inwardly towards the wheel axis 3 about which the implant wheel 1 is arranged to spin. The wheel axis 3 is at an angle with respect to the direction of the ion beam 4 as indicated by the arrow in FIG. 1. The scan arm is rotatable about a scan axis 5 which is directly below the wheel axis 3 and extends in the same direction as the wheel axis 3. The wheel 1 spins about the wheel axis 3 as the scan arm reciprocably scans the wheel 1 in a direction of arrow 6. During this time, the wafer support surfaces 7 on which wafer are supported are kept perpendicular to the direction of the ion beam 4. As will be appreciated from FIG. 1 as the scan arm scans the wheel 1 in the direction of arrow 6, the wafer support surfaces 7 will be moved in the direction of the ion beam 4 as indicated by arrow 8. In order to vary the direction of implantation, the wheel 1 is also rotatable through a limited angle about a first tilt axis 9A perpendicular to the wheel axis, extending across a diameter of the wheel 1 and intersecting the ion beam 4. As an alternative, the wheel 1 may be rotatable through a limited angle about a second tilt axis 9B passing through the plane of the substrate on the wafer support surface 7 being scanned.

Figure 2:
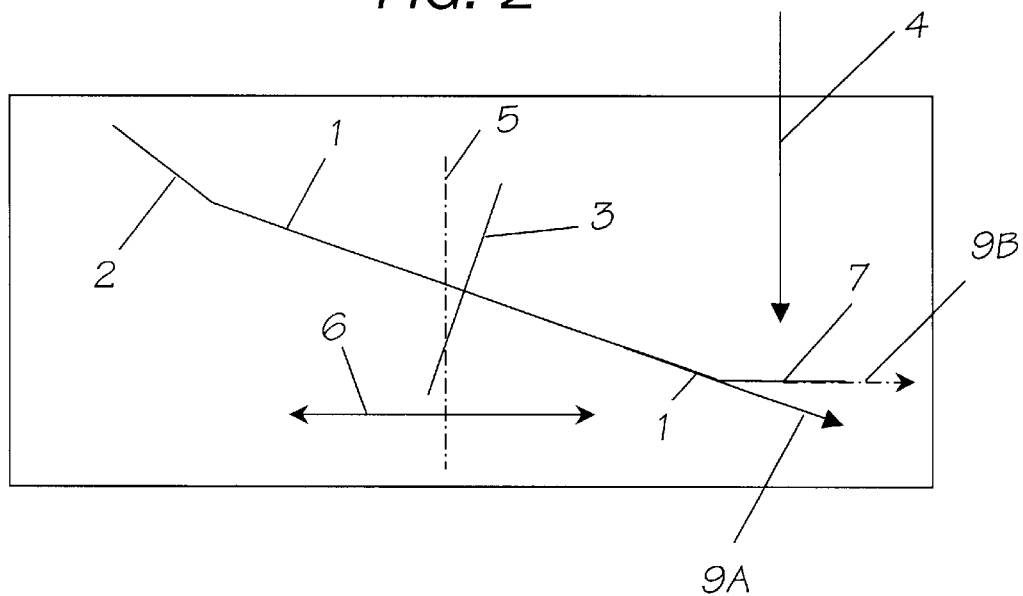
FIG. 2 is a schematic diagram showing the various axes of the ion implantation apparatus of the present invention.

In FIG. 2 the same reference numerals are used to designate the same parts as in FIG. 1. The fundamental difference between FIGS. 1 and 2 is that, in FIG. 2, the scan axis 5 is now parallel to the direction of the ion beam 4 while the wheel axis 3 is angularly offset with respect to the scan axis 5. The angular offset is such that the perpendicular relationship between the support surfaces 7 and ion beam 4 is preserved. Now, as the scan arm moves the wheel in the direction of the arrow 6, the wafer support surfaces 7 will remain in the same plane. In other words, they will not move in the direction of the ion beam 4. Also, when the wheel is rotated about the first tilt axis 9A to vary the angle of implantation, it is apparent from FIG. 2 that there will be very little travel of the support surfaces 7 in the ion beam direction. When the wheel is rotated about the second tilt axis 9B even this little travel is eliminated.

Figure 4:
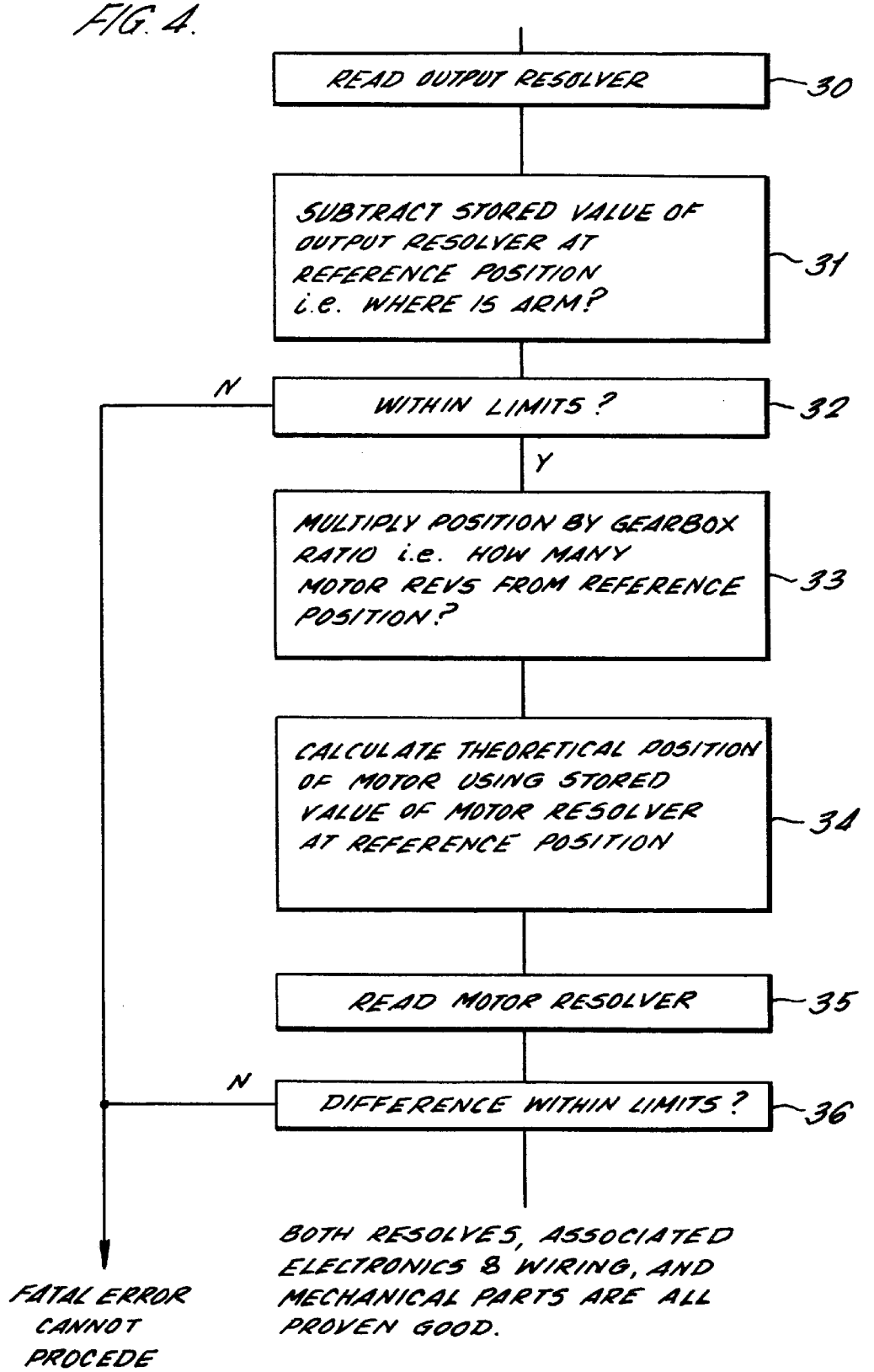
FIG. 4 is a flow chart showing the determination of the integrity of the system on start up.

In order to make an apparatus to provide the geometry of FIG. 2, it is simply a matter of adapting the apparatus of U.S. Pat. No. 5,641,969 so that the scan axis (which is illustrated in U.S. Pat. No. 5,641,969 as reference numeral 18) is parallel to the direction of the ion beam, while the scanning arm (illustrated in U.S. Pat. No. 5,641,969 as reference numeral 12) has the mounting hub (illustrated in U.S. Pat. No. 5,641,969 as reference numeral 33) offset at the appropriate angle. The same tilting mechanism, which will be offset together with the mounting hub, can be employed to provide the first tilt axis 9A. In order to provide the second tilt axis 9B, it is simply a matter of making the necessary adjustments to the orientation of the axis 37 as shown in FIG. 4 of U.S. Pat. No. 5,641,969. This is believed to be a simple modification which can be readily carried out by the skilled person so that further description of this will not be included here.

Figure 3:
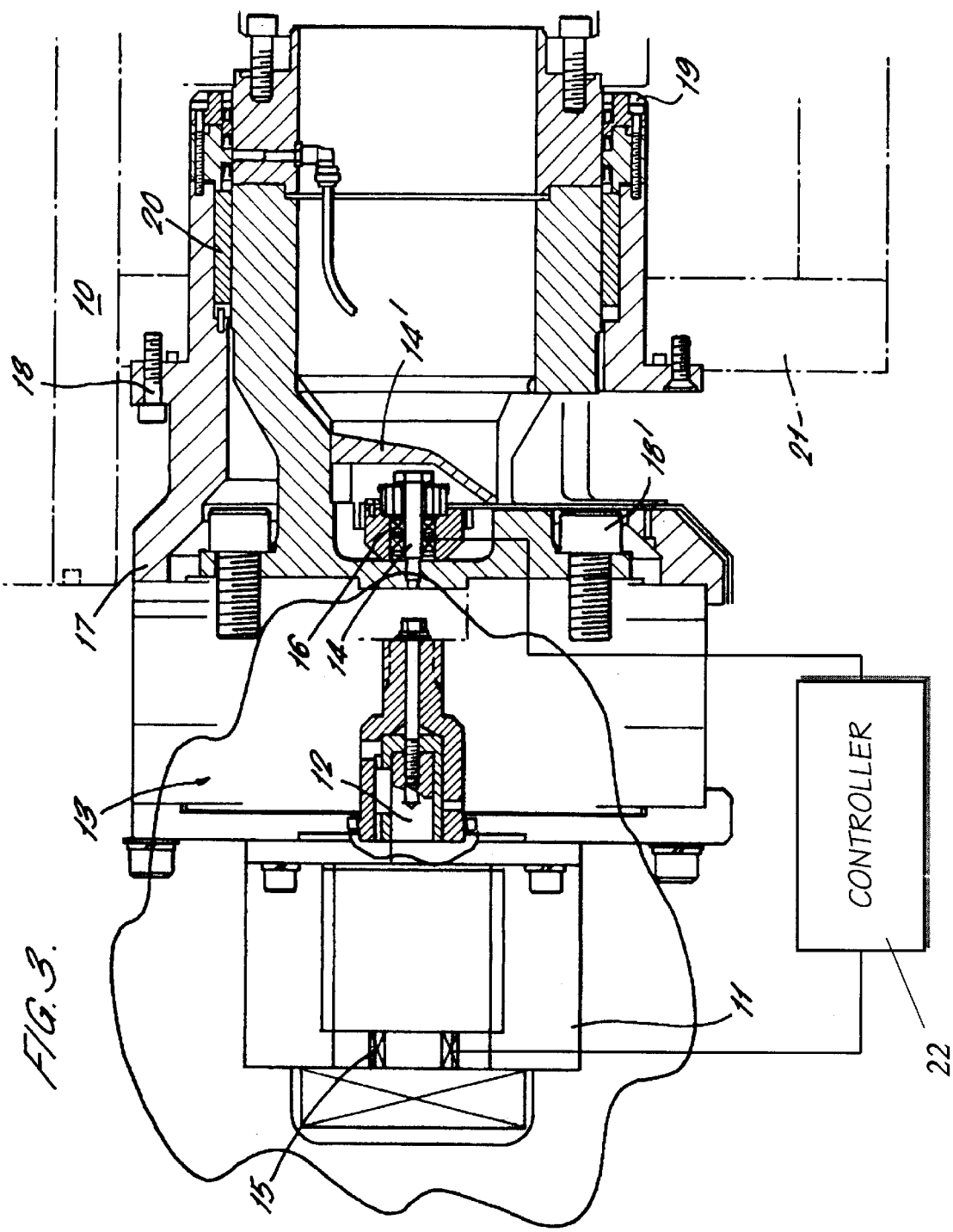
FIG. 3 is a cross-section through the drive chain for the scan arm.

FIG. 3 shows the drive train for the scan arm 10. The scan arm 10 is driven by a motor 11 having a drive shaft 12 which inputs directly into a cycloid type gearbox 13 having an output shaft 14 which directly drives the scan arm 10. The motor 11 is a relatively low power brushless dc servo motor, while the gearbox is a cycloid type gearbox such as that produced by Sumitoyo Corporation of Japan. The gear box 13 is chosen as one which will provide high torque, which, although not required for the operation of the scan arms is used for its ability to resist high torque in the event of failure.

On the drive shaft 12 is a motor resolver 15, while on the output shaft 14 is an output resolver 16. The resolvers are essentially rotary position detectors which produce an output proportional to the rotational displacement of the respective shafts 12, 14. It will be appreciated that the readings from the two resolvers will be substantially proportional to one another, the constant of proportionality being the ratio provided by the gearbox 13.

The housing of the gearbox 13 is mounted to the housing process chamber of the implant apparatus via outer housing 17 using a plurality of bolts 18. The output shaft 14 is fitted to the gearbox by a plurality of bolts 18' and extends through a differential pump seal assembly 19 of conventional design. A cable guide 14' is provided within the output shaft to guide cables into the interior of output shaft 14. All of the scan load, and mass is carried to the gearbox 13. The gearbox outer housing 17 extends inside the process chamber and carries the outer portion of the seal assembly.

The setting up and the calibration of the apparatus will now be described with reference to FIGS. 4 to 7.

The resolvers are fitted to the apparatus in a random configuration so initially their positions are meaningless. During set-up, the scan arm is moved to a reference position (e.g. a vertical position), and a button pressed to teach the reference position to the controller software. At this point the values from the two resolvers are stored in non-volatile memory. As the gearbox ratio is accurately known, the theoretical value of the motor resolver can be calculated for any position of the output resolver. This is used at start-up to verify the position of the scan arm, and is periodically used to verify the correct operation of the two resolvers, their circuits, and the integrity of the mechanical system as described in more detail below.

This verification process is shown in FIG.4. As step 30, a reading is taken from the output resolver upon start-up, and this reading is subtracted from the reference position at step 31 in order to determine the position of the arm. Step 32 clarifies whether or not this reading is within the correct limits and notifies the operator if there is a problem. Knowing the gear box ratio, it is possible to determine at step 33 the number of motor revs from the motor position and calculate at step 34 the theoretical position of the motor using the stored reference value for the motor resolver at the reference position. At step 35, a reading is taken from the motor resolver, and step 36 determines whether or not the difference between the calculated and read values of the motor resolver is within acceptable limits. If not, the system alerts an operator. If the difference is within acceptable limits, this provides an indication of the integrity of a mechanical and electronic systems.

In operation, the position loop is closed round the output resolver. In other words, the motor controller receives feedback from the output resolver, and drives the motor until the output resolver reaches the desired position. In this situation, the output from the motor resolver is not used to control the arm, but is only used for motor communication. However, any position error from the output resolver will result in the equivalent error appearing on the scan profile. Resolver errors are reduced to a minimum by the use of precision mechanical and electronic parts, but a significant error can still exist. To compensate for this, the system performs the calibration operation as shown in FIG.5.

Having moved the arm to the reference position and stored values from the two resolvers as described above, and as illustrated as steps 41 and 42, the apparatus is then switched to feedback mode in which only the motor resolver is used for motion as shown in step 43. As step 44, the arm is moved to one end of its travel, and is moved in small steps across its entire range of movement, as determined by the motor resolver, and the value for the output resolver is stored in each case. Once this process is complete, the arm is returned at step 45 to its reference position. For each motor position, the theoretical value of the output resolver is calculated at step 46 from the reading of the motor resolver and the gearbox ratio. This is subtracted from the read values from the output resolvers at step 47 to generate the set of error values which are as shown graphically in FIG.6A.

Figure 6A:
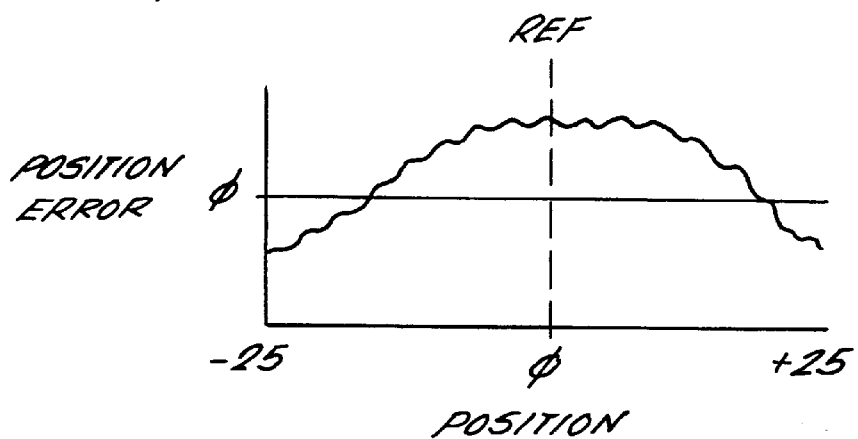
FIGS. 6A to 6C show the error signals produced at stages of the operation of FIG. 5.
Figure 6B:
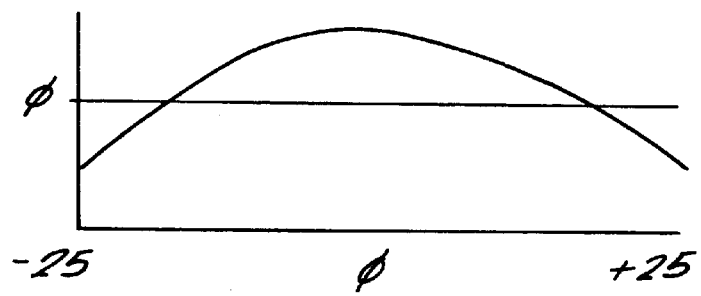
Figure 6C:
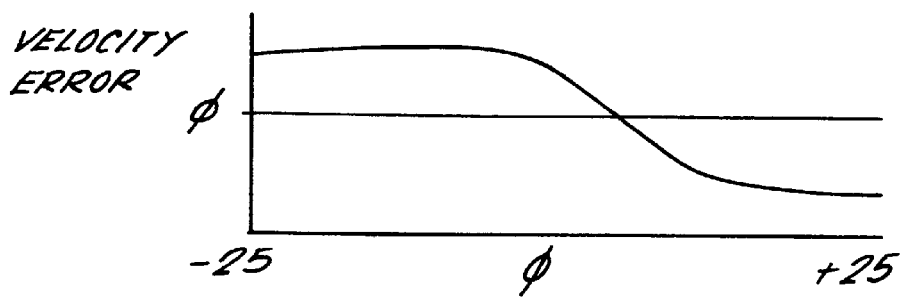

The errors come from two sources, namely gearbox ripple, and the output resolver non-linearity. The gearbox ripple has a frequency determined by the gearbox manufacture, and can be readily removed by filtration at step 48 to provide an error plot as shown in FIG. 6B which represents only the error generated by the output resolver non-linearity. By differentiating this data at step 49, the velocity error as shown in FIG.6C can be generated. This velocity error data can then be applied to a look up table containing the figures for the required theoretical velocity profile as shown at step 50. For reasons that will be described in more detail below, this velocity profile data is then interpolated to provide a table which typically has 400 sets of data as shown at step 51. The feedback mode is then changed at step 52 so that the position is controlled by the output resolver for normal operation.

A control system 22 (FIG. 3) is required in order to ensure that the scan arm is accurately moved through the velocity profile generated as described above.

Figure 7A:
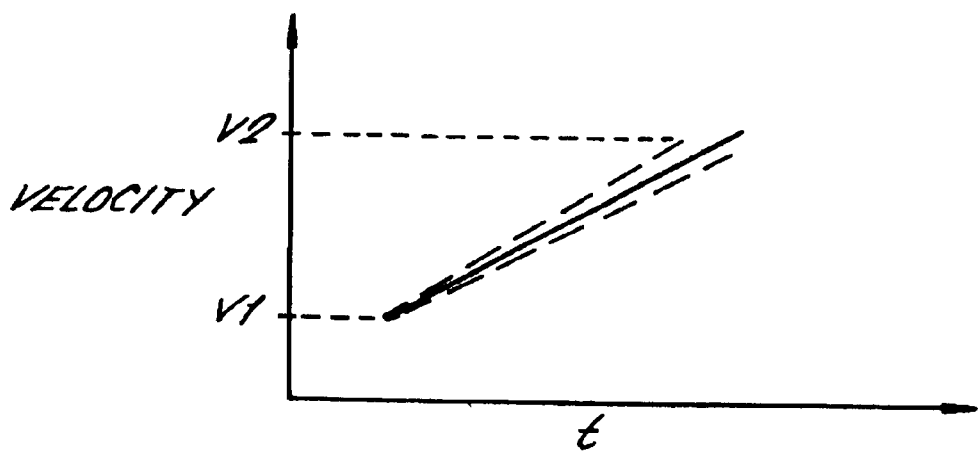
FIGS. 7A and 7B are graphs showing velocity control for the prior art and according to the present invention respectively.

The established method for this, as described by the motor controller vendor, is to use three data tables, holding (say) 50 values each of position, velocity and acceleration, based on equal intervals of position. These values represent a series of linear segments approximating the velocity profile. One such segment is shown in FIG. 7A. The motor is then instructed to accelerate at a given rate, from a first velocity V1 to a second velocity V2, as illustrated in FIG. 7A until a given position is reached, these values coming from the data tables. When the given position is reached, a new instruction is issued with the next values from the tables. Whilst being adequate for most applications, this method has failings in this application. The overall error is largely dependant upon the tuning of the closed loop control system, as this controls how quickly the motor assumes the commanded acceleration value, causing the accuracy to vary from system to system. Secondly, a position error develops which accumulates with time. In other words, because the arm is not accelerated instantaneously to the required acceleration, it may not achieve the desired velocity at the desired position.

Figure 7B:
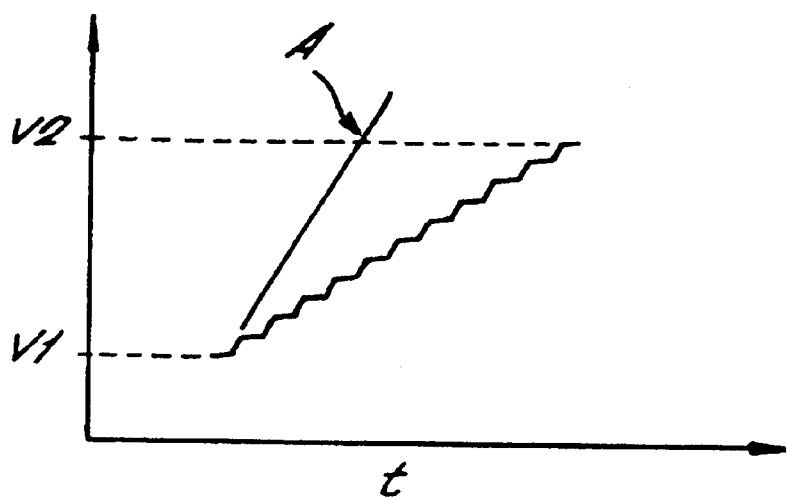

The improved method developed involves creating only two much larger data tables typically having 400 values each for velocity and position which are calculated to give equal distance increments as described above. This means that the motor is fed new velocity values more frequently as its speed increases. This is shown in FIG. 7B. The values for $V_1$ and $V_2$ are the same as for FIG. 7A above. However, because of the larger number of values in the tables, the arm is given ten intermediate velocity values between $V_1$ and $V_2$. It is driven between intermediate velocities at the highest possible acceleration as shown by arrow A in FIG. 7B, such that it will reach the next intermediate velocity before it is required to do so. The control system will then instruct the arm to stop accelerating. As drawn in FIG. 7B, it would appear that the acceleration is a stepped increase which would tend to cause vibration. However this is not the case in practice because of the high frequency of updates, and the inherent lag in the system. In fact, the true acceleration of the arm will be a generally smooth line from $V_1$ to $V_2$. As this system is not critically dependent on the acceleration (which is always excessive) the arm will not lag behind the required velocity when it reaches the required position. This method gives a more accurate velocity/position profile which is less sensitive to closed loop tuning parameters.

In previous designs, optical sensors were attached to the mechanism to provide position information to safety circuits and other related equipment. To reduce the cabling and mechanical parts associated with this function (and hence improve reliability) these position signals are now generated from the output resolver. An electronic circuit is pre-programmed with data from the mechanical drawings, to provide the various position signals. The positions correspond to various positions of the scan arm, such as the wafer loading position, the two ends of scan travel and two extreme positions beyond which it is unsafe for the scan arm to travel, at which point power to the arm is cut. The circuit has two inputs, one from the resolver, the other form a bank of switches which define the actual position of the resolver at the reference position of the scan arm. When the system is taught the reference position, the controller software calculates the value that the switches need to be set to, and prints this setting. Once the switches have been set, all the position signals will be accurately generated. The controller cannot set the resolver offset value itself electronically, as this would mean that the value could become corrupted in event of a controller software crash, and safety signals could become incorrect.

What is claimed is:

1. An ion implantation apparatus comprising a vacuum chamber, an ion beam generator to generate an ion beam in the vacuum chamber, an implant wheel in the vacuum chamber, having a plurality of circumferentially distributed wafer support elements each having a wafer support surface canted inwardly towards the centre of the implant wheel, a scanning arm mounted for reciprocal movement about a scan axis and having a free end supporting the implant wheel for rotation about a wheel axis, so that rotation of the implant wheel about the wheel axis brings the wafer support elements successively to intercept the ion beam and reciprocation of the scanning arm about the scan axis scans the ion beam across the wafer support elements, wherein the wheel is rotatable with respect to the arm about a tilt axis, which substantially intersects the wheel axis and ion beam, to vary the angle of implantation, and wherein the scan axis is substantially parallel to the direction of the ion beam, and the direction of the wheel axis is offset from the direction of the scan axis such that the ion beam is substantially perpendicular to the wafer support surfaces when the implant wheel is not tilted.

2. An ion implantation apparatus according to claim 1, wherein the tilt axis is orientated between a direction in which it is substantially perpendicular to the wheel axis, and a direction in which it passes substantially through the plane of the substrate support for the substrate being scanned by the ion beam.

3. An ion implantation apparatus according to claim 1, wherein the tilt axis is substantially perpendicular to the wheel axis.

4. An ion implantation apparatus according to claim 1, wherein the tilt axis passes substantially through the plane of the substrate support for the substrate being scanned by the ion beam.

5. An ion implantation apparatus comprising:

a vacuum chamber, an ion beam generator to generate an ion beam in the vacuum chamber, an implant wheel provided in the vacuum chamber, having a plurality of circumferentially distributed wafer support elements, a scanning arm mounted for reciprocal movement about a scan axis and having a free end supporting the implant wheel for rotation about a wheel axis, so that rotation of the implant wheel about the wheel axis brings the wafer support elements successively to intercept the ion beam and reciprocation of the scanning arm about the scan axis scans the ion beam, across the wafer support elements, and a motor for driving the scanning arm, the motor having a drive shaft, a cycloid type gearbox connected to the drive shaft of said motor and having an output shaft driving the scanning arm, wherein a first rotary position detector is provided on the drive shaft and a second rotary position detector is provided on the output shaft.

6. A method of verifying the mechanical integrity of an apparatus according to claim 5, the method comprising the steps of:

taking a reading from the second rotary position detector, calculating the theoretical position of the motor from the reading taken from the second rotary position detector and from the gearbox ratio, measuring the actual position of the motor from the first rotary position detector, and comparing the actual position of the motor with the theoretical position of the motor.

7. A method of correcting a velocity profile for an apparatus according to claim 5, the method comprising the steps of:

driving the scan arm across a range of movement, and noting readings from both rotary position detectors in each position, calculating from each first rotary position detector reading and from the gearbox ratio the theoretical second rotary position detector reading in each position, subtracting the theoretical second rotary position detector reading from the actual second rotary position detector reading in each position, processing the data generated in order to remove errors generated by sources other than second rotary position detector non-linearity to obtain data indicative only of second rotary position detector non-linearity, differentiating this data to produce data indicative of velocity error, and applying this velocity error to a look up table of the desired velocity profile.

8. A method of driving a member through a predetermined velocity profile, the method comprising:

compiling numerical tables for velocity and position for the velocity profile, using values from the numerical tables instructing the member to move from a first position at which it is traveling at a first velocity to a second position at which it is traveling at a second velocity at an acceleration at which the member will reach the second velocity before it reaches the second position and will hence stop accelerating until it reaches the second position, and selecting the rate of reading values from the numerical tables to be fast enough that the inherent lag in the control system causes smooth acceleration of the arm throughout the velocity profile.

9. An ion implantation apparatus comprising:

a vacuum chamber, an ion beam generator to generate an ion beam in the vacuum chamber, an implant wheel in the vacuum chamber, having a plurality of circumferentially distributed wafer support elements, a scanning arm mounted for reciprocal movement about a scan axis and having a free end supporting the implant wheel for rotation about a wheel axis, so that rotation of the implant wheel about said wheel axis brings the wafer support elements successively to intercept the ion beam and reciprocation of the scanning arm about the scan axis scans the ion beam across the wafer support elements, a motor for driving the scanning arm, the motor having a drive shaft, a cycloid gearbox connected to the drive shaft of said motor and having an output which directly drives the scanning arm.

10. An ion implantation apparatus comprising:

a vacuum chamber, an ion beam generator to generate an ion beam in the vacuum chamber, an implant wheel in the vacuum chamber, having a plurality of circumferentially distributed wafer support elements, a scanning arm mounted for reciprocal movement about a scan axis and having a free end supporting the implant wheel for rotation about a wheel axis, so that rotation of the implant wheel about the wheel axis brings the wafer support elements successively to intercept the ion beam and reciprocation of the scanning arm about the scan axis scans, the ion beam, across the wafer support elements, a motor for driving the scanning arm, the motor having a drive shaft;

a gearbox connected to said drive shaft of said motor and having an output shaft driving the scanning arm, wherein a first rotary position detector is provided on the drive shaft of the motor and a second rotary position detector is provided on the output shaft of the gearbox, and a control system receiving position signals from said first and second position detectors and including numerical tables for velocity and position control establishing a velocity profile of the scanning arm, said control system using values from the numerical tables for instructing the scanning arm to move from a first position at which it is travelling at a first velocity to a second position at which it is travelling at a second velocity at an acceleration at which the scanning arm will reach the second velocity before it reaches the second position and will hence stop accelerating until it reaches the second position, said control system selecting the rate of reading values from the numerical tables to be fast enough that the inherent lag in the control system causes smooth acceleration of the scanning arm throughout the velocity profile.

11. The apparatus of claim 10 wherein said gearbox is a cycloidal gearbox.

12. An ion implantation apparatus comprising:

a vacuum chamber, an ion beam generator to generate an ion beam in the vacuum chamber, an implant wheel in the vacuum chamber, having a plurality of circumferentially distributed wafer support elements, a scanning arm mounted for reciprocal movement about a scan axis and having a free end supporting the implant wheel for rotation about a wheel axis, so that rotation of the implant wheel about the wheel axis brings the wafer support elements successively to intercept the ion beam and reciprocation of the scanning arm about the scan axis scans the ion beam, across the wafer support elements, a motor for driving the scanning arm, the motor having a drive shaft;

a gearbox connected to said drive shaft of said motor and having an input/output gearbox ratio and which has an output shaft driving the scanning arm, wherein a first rotary position detector is provided on the drive shaft and a second rotary position detector is provided on the output shaft, and a control system receiving a reading from the second rotary position detector, and arranged to calculate the theoretical position of the motor from the reading taken from the second rotary position detector and from the gearbox ratio, for measuring the actual position of the motor from the first rotary position detector, and comparing the actual position of the motor with the theoretical position of the motor, the control system also receiving position signals from said first and second position detectors and including numerical tables for velocity and position control for establishing a velocity profile of the scanning arm, said control system using values from the numerical tables for instructing the scanning arm to move from a first position at which it is travelling at a first velocity to a second position at which it is travelling at a second velocity at an acceleration at which the scanning arm will reach the second velocity before it reaches the second position and will hence stop accelerating until it reaches the second position, and for selecting the rate of reading values from the numerical tables to be fast enough that the inherent lag in the control system causes smooth acceleration of the scanning arm throughout the velocity profile.

13. An ion implantation apparatus comprising:

a vacuum chamber, an ion beam generator to generate an ion beam in the vacuum chamber, an implant wheel in the vacuum chamber, having a plurality of circumferentially distributed wafer support elements, a scanning arm mounted for reciprocal movement about a scan axis and having a free end supporting the implant wheel for rotation about a wheel axis, so that rotation of the implant wheel about the wheel axis brings the wafer support elements successively to intercept the ion beam and reciprocation of the scanning arm about the scan axis scans the ion beam, across the wafer support elements, a motor for driving the scanning arm, the motor having a drive shaft;

a cycloid gearbox connected ot said drive shaft of said motor and having an output shaft, wherein a first rotary position detector is provided on the drive shaft and a second rotary position detector is provided on the output shaft, and a control system receiving position signals from said first and second position detectors such that when the scan arm is driven across a range of movement, readings are taken and recorded by the control means from both rotary position detectors in each position, the control means being operable to (a) calculate, from each first rotary position detector reading and from the gearbox ratio, the theoretical second rotary position detector reading in each position, (b) subtract the theoretical second rotary position detector reading from the actual second rotary position detector reading in each position, (c) process the data generated in order to remove errors generated by sources other than second rotary position detector non-linearity to obtain data indicative only of second rotary position detector non-linearity, (d) differentiate this data to produce data indicative of velocity error, and (e) apply this velocity error to a look up table of the desired velocity profile.

\* \* \* \* \*